(12) United States Patent
Truskett et al.

(10) Patent No.: US 8,480,933 B2
(45) Date of Patent: Jul. 9, 2013

(54) FLUID DISPENSE DEVICE CALIBRATION

(75) Inventors: Van Nguyen Truskett, Austin, TX (US);
Stephen C. Johnson, Austin, TX (US);
Niyaz Khusnatdinov, Round Rock, TX (US); Logan Simpson, Coupland, TX (US)

(73) Assignee: Molecular Imprints, Inc., Austin, TX (US)

( * ) Notice: Subject to any disclaimer, the term of this patent is extended or adjusted under 35 U.S.C. 154(b) by 854 days.

(21) Appl. No.: 12/582,041

(22) Filed: Oct. 20, 2009

(65) Prior Publication Data

US 2010/0098848 A1    Apr. 22, 2010

Related U.S. Application Data

(60) Provisional application No. 61/107,360, filed on Oct. 22, 2008, provisional application No. 61/107,837, filed on Oct. 23, 2008, provisional application No. 61/109,608, filed on Oct. 30, 2008.

(51) Int. Cl.
*B29C 45/76* (2006.01)

(52) U.S. Cl.
USPC .......................................................... 264/40.1

(58) Field of Classification Search
USPC .......................................................... 264/40.1
See application file for complete search history.

(56) References Cited

U.S. PATENT DOCUMENTS

2007/0076040 A1* 4/2007 Shang et al. .................... 347/19

FOREIGN PATENT DOCUMENTS

KR           100781997           12/2007

* cited by examiner

*Primary Examiner* — Larry Thrower
(74) *Attorney, Agent, or Firm* — Cameron A. King

(57) ABSTRACT

Systems and methods for calibrating a dispense head to provide substantially uniform droplets on a substrate are described.

2 Claims, 9 Drawing Sheets

| TARGET 5.0pL (Vt) | Initial Voltage (Vi) | Average droplet diameter D<sub>AVG</sub> | Adjust Voltage |
|---|---|---|---|
| Row 1 | 21.7 | 281.1µm | - |
| Row 2 | 21.7 | 272.9µm | Increase voltage |
| Row 3 | 21.7 | 331.0µm | Decrease voltage |

Circle fitted to the drop

FLUID DISPENSE DEVICE CALIBRATION

CROSS RELATION

This application claims priority to U.S. Provisional Patent Application No. 61/107,360 filed Oct. 22, 2008; U.S. Provisional Patent Application No. 61/107,837 filed Oct. 23, 2008; and U.S. Provisional Patent Application No. 61/109,608 filed Oct. 30, 2008; all of which are hereby incorporated by reference herein.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a polymerizable layer (formable liquid) and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Lithographic System

Figure 1:
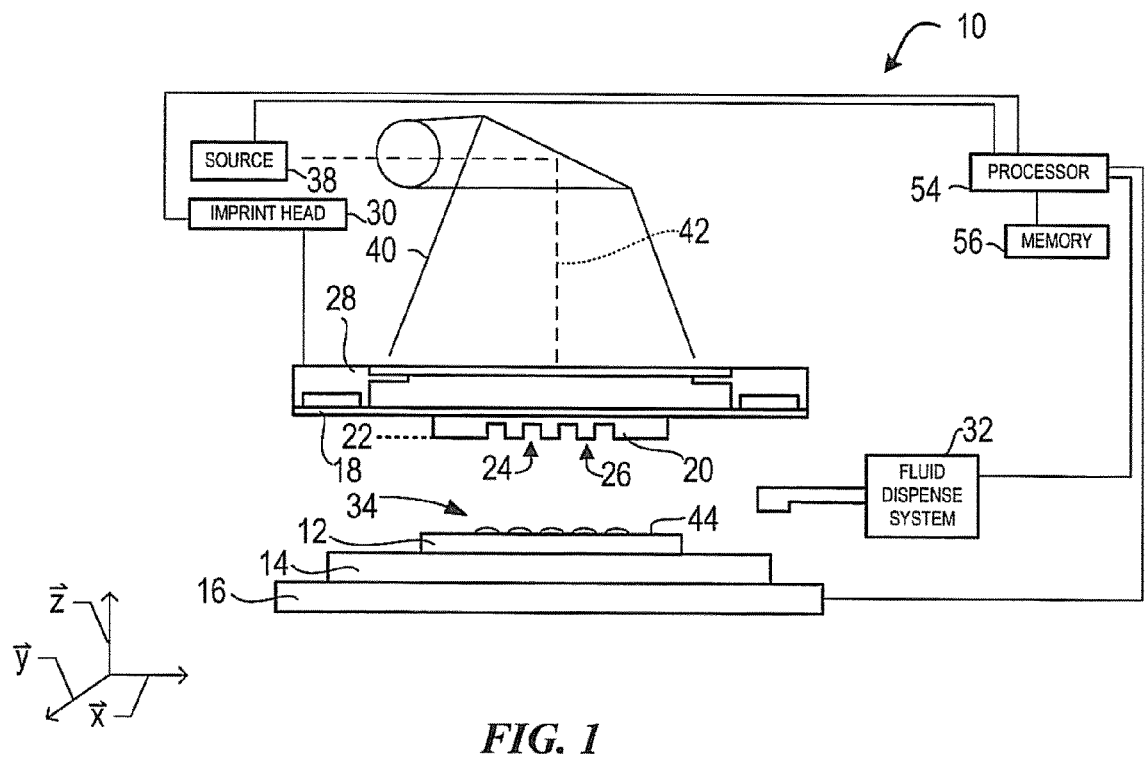
FIG. 1 illustrates a simplified side view of a lithographic system in accordance with one embodiment of the present invention.

Referring to the figures, and particularly to FIG. 1, illustrated therein is a lithographic system 10 used to form a relief pattern on a substrate 12. Substrate 12 may be coupled to a substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference herein.

Substrate 12 and substrate chuck 14 may be further supported by a stage 16. Stage 16 may provide motion about the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, with mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to a chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, chuck 28 may be coupled to an imprint head 30 such that chuck 28 and/or imprint head 30 may be configured to facilitate movement of template 18.

System 10 may further comprise a fluid dispense system 32. Fluid dispense system 32 may be used to deposit a polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer as described in U.S. Pat. No. 7,157,036 and U.S. Patent Publication No. 2005/0187339, all of which are hereby incorporated by reference herein.

Figure 2:
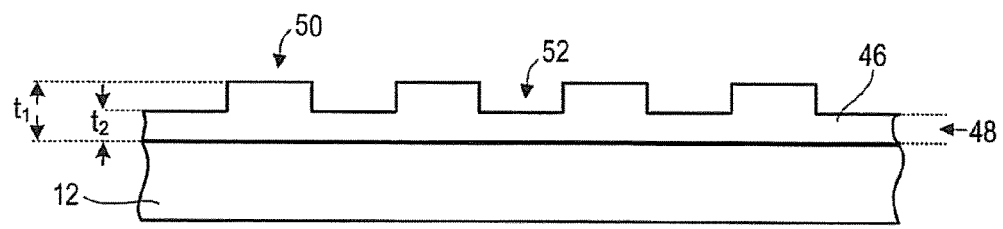
FIG. 2 illustrates a simplified side view of the substrate shown in FIG. 1 having a patterned layer positioned thereon.

Referring to FIGS. 1 and 2, system 10 may further comprise an energy source 38 coupled to direct an energy 40 along a path 42. Imprint head 30 and stage 16 may be configured to position template 18 and substrate 12 in superimposition with path 42. System 10 may be regulated by a processor 54 in communication with at least stage 16, imprint head 30, fluid dispense system 32, and/or source 38, and may operate on a computer-readable program stored in a memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to a shape of a surface 44 of substrate 12 and patterning surface 22 of mold 20, defining a patterned layer 46 on substrate 12. Patterned layer 46 may comprise a residual layer 48 and a plurality of features shown as protrusions 50 and recessions 52, with protrusions 50 having thickness $t_1$ and residual layer 48 having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

Fluid Dispense System 32

Figure 3:
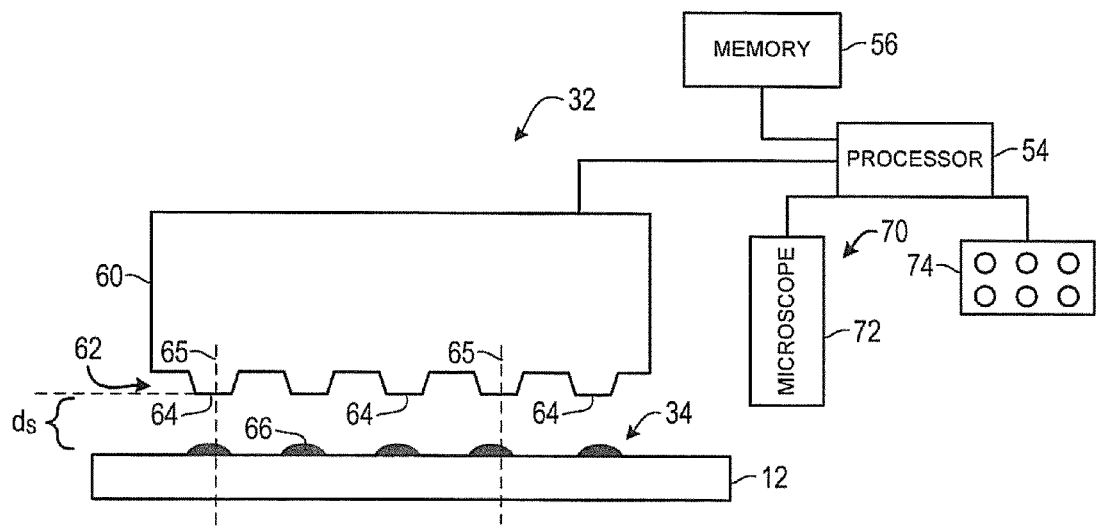
FIG. 3 illustrates a simplified side view of an exemplary embodiment of a fluid dispense system.

As described above, polymerizable material 34 may be applied to the volume between mold 20 and substrate 12 using fluid dispense system 32. FIG. 3 illustrates an exemplary embodiment of fluid dispense system 32. Fluid dispense system 32 may comprise a dispense head 60 and a nozzle system 62. Nozzle system 62 may comprise a single tip 64 or a plurality of tips 64 depending on the specific implementation desired. For example, FIG. 3 illustrates nozzle system 62 comprising a plurality of tips 64. Generally, polymerizable material 34 propagates through dispense head 60 and egresses from tip 64 of nozzle system 62. Tip 64 defines a dispensing axis 65 at which polymerizable material 34 may be positioned on substrate 12. The distance $d_s$ between tip 64 and substrate 12 may be selected so as to minimize, if not prevent, splashing and/or drop location drifting; minimize, if not prevent, gas from being present; and/or other similar design considerations. Further, referring to FIG. 4, each droplet 66 may have a diameter D and a volume $V_D$ associated therewith. In an example, volume $V_D$ of droplets 66 may be on the order of approximately 1-1000 picoliters and diameter D may be on the order of approximately 1 micron to 1 mm.

Polymerizable material 34 may be positioned upon substrate 12 by fluid dispense system 32 on substrate 12 as a droplet 66 or a plurality of droplets 66. Exemplary droplet techniques for depositing polymerizable material 34 on substrate 12 are described in detail in U.S. Patent Publication No. 2005/0270312 and U.S. Patent Publication No. 2005/0106321, all of which are hereby incorporated by reference herein.

Figure 4:
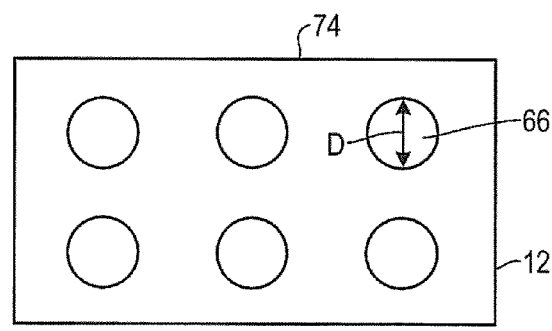
FIG. 4 illustrates an exemplary image provided by the fluid dispense system of FIG. 3.

Referring to FIGS. 3 and 4, fluid dispense system 32 may further comprise a vision system 70. Vision system may include a microscope 72 (e.g. optical microscope) to provide at least one image 74 of droplets 66 on substrate 12. Microscope 72 may be regulated by processor 54, and further may operate on a computer-readable program stored in memory 56. Processor 54 may evaluate image 74 of droplets 66 provided by microscope 72. Alternatively, evaluation of the image 74 of droplet 66 may be manually provided by a user. Microscope 72 and/or processor 54 may provide feedback to control dispensing of droplets 66 from dispense head 60.

Varying Voltage Applied to Dispense Heads 60

Dispense head 60 may comprise a liquid dispensing actuator able to control the volume $V_D$ of droplets 66 by varying a voltage Vi applied to dispense head 60, and in further embodiment, to each tip 64. In an embodiment, dispense head 60 may comprise micro-solenoid valves or piezo-actuated dispensers. Piezo-actuated dispensers are commercially available from MicroFab Technologies, Inc. of Plano, Tex.

Figure 5:
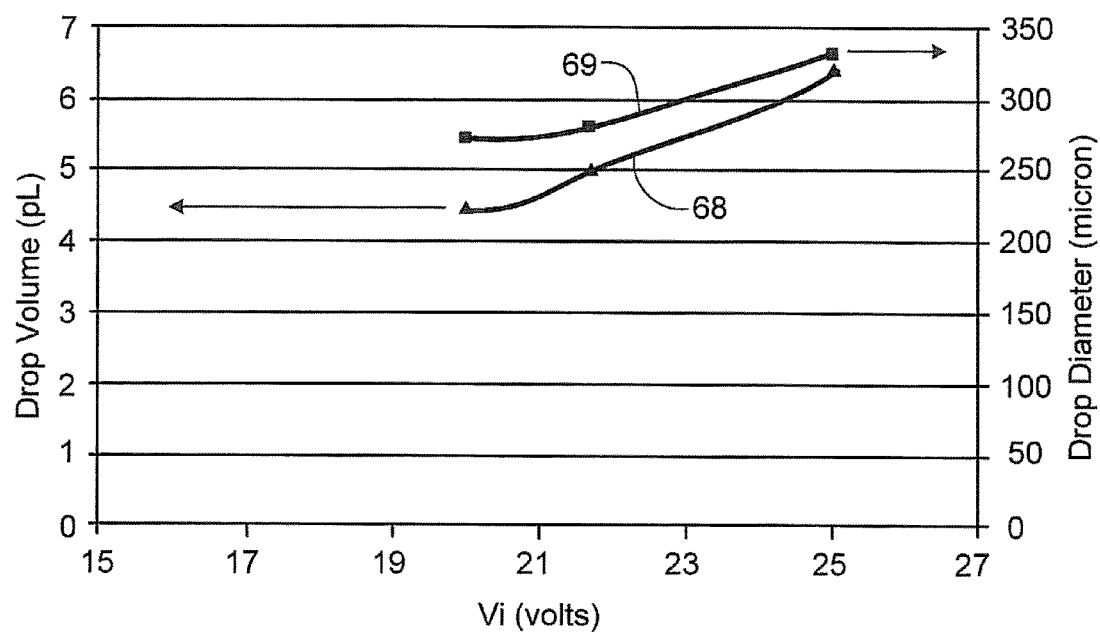
FIG. 5 is a graphical representation of the relationship between voltage applied to a dispense head and drop volume of a droplet on a substrate and the relationship between voltage applied to a dispense head and drop diameter of a droplet on a substrate.

In using liquid dispensing actuators, the magnitude of voltage Vi applied to dispense head 60 may correlate with droplet volume $V_D$ and droplet diameter D for each droplet 66. In a further embodiment, voltage Vi may directly control droplet volume $V_D$ and droplet diameter D for each droplet 66. As illustrated in the graph of FIG. 5, voltage Vi and droplet volume $V_D$ may be defined by a substantially linear relationship such that an increase in voltage Vi applied to dispense head 60 results in an increase in droplet volume $V_D$ as illustrated by numeral 68. Additionally, voltage Vi and droplet diameter D may be defined by a substantially linear relationship such that an increase in voltage Vi applied to dispense head 60 results in an increase in droplet diameter D as illustrated by numeral 69. Based on these relationships, droplet diameter D may be analyzed to provide the voltage Vi resulting in the targeted volume $V_T$ for droplet 66, the targeted volume $V_T$ being the desired volume for droplet 66.

Figures 6, 7:
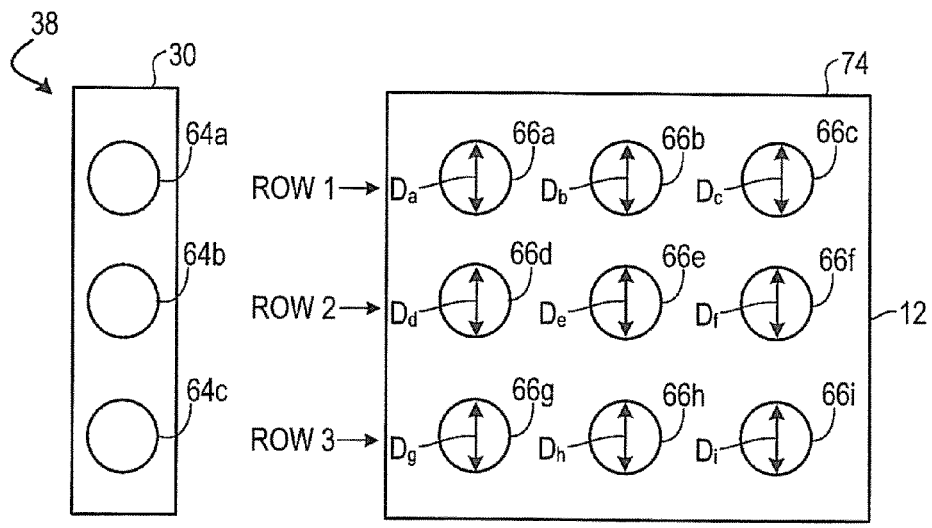
FIG. 6 illustrates an exemplary fluid dispense system and associated image.
FIG. 7 is a table of average droplet diameter of rows illustrated in FIG. 6.

Referring to FIGS. 6 and 7, analysis of droplet diameter D in image 74 may be used to calibrate voltage Vi applied to dispense head 60 to provide targeted volume $V_T$ for droplets 66.

When imprinting substrates 12 employing multiple dispense heads 64, it may be desired to match the drop volume $V_D$ dispensed by each dispense head 64. Having differing drop volumes $V_D$ across droplets 66 may result in a varying residual layer thickness $t_2$, shown in FIG. 2, of patterned layer 46 and may eventually lead to pattern transfer problems, which is undesirable.

In an example, a targeted volume $V_T$ for one or more droplets 66 may be assessed. Droplets 66 having volume $V_D$ may be dispensed based on the initial voltage Vi. In an embodiment, droplets 66 may be deposited such that each droplet 66 may spread on substrate 12 while minimizing a probability of contact with other droplets 66. In a further embodiment, droplets 66 may be deposited such that each droplet 66 may spread on substrate 12 without contacting other droplets 66. It should be noted that droplets 66 may be deposited on substrate 12 in any pattern desired. The use of the 3×3 grid pattern illustrated in FIG. 6 is for simplicity of illustration and description.

An optional macroscopic analysis of the drop pattern of droplets 66 may be provided. Such macroscopic analysis may evaluate the drop pattern for fidelity. For example, the drop pattern of droplets 66 may be evaluated to determine if droplets 66 are aligned and/or if any droplet 66 within the drop pattern includes misshapen edges. This macroscopic analysis may be used as a pre-screen to determine initial voltage Vi. However, the macroscopic analysis may be performed at any interval during the imprint process to determine the current voltage Vi being applied to the tips 64.

For each droplet 66, the droplet diameter D thereof may be assessed. Furthermore, an average droplet diameter $D_{AVG}$ for each row 1-3 of the 3×3 grid may be determined. Based on the average droplet diameter $D_{AVG}$, fluid dispense system 32 may be calibrated to adjust the voltage Vi for each tip 64 to provide adjusted voltage $Vi_{ADJ}$. Such adjustments to the voltage Vi may be made to either increase or decrease average droplet diameter $D_{AVG}$ until targeted volume $V_T$ may be reached for each droplet 66.

FIG. 7 illustrates a table providing exemplary values for initial voltage Vi, average droplet diameter $D_{AVG}$, and targeted volume $V_T$ for rows 1-3 of FIG. 6. As shown, the targeted volume $V_T$ for droplets 66 in rows 1-3 of image 74 may be 5.0 pL. It should be noted that droplets within the same image 74 may have different targeted volumes $V_T$.

In FIG. 7, the initial voltage Vi applied across all rows 1-3 provide varying average droplet diameters $D_{AVG}$. For example, initial voltage Vi applied to tip 64a provides droplets with an average droplet diameter of 281.1 μm; however, the same initial voltage Vi applied to tips 64b and 64c provide droplets with an average droplet diameter of 272.9 μm and 331.0 μm, respectively. If the average droplet diameter $D_{AVG}$ of row 1 provides for the targeted volume $V_T$, initial voltage Vi may be increased to tip 64b to provide an increase in the average droplet diameter $D_{AVG}$ of row 2, and decreased to tip 64c to provide a decrease in the average droplet diameter $D_{AVG}$ of row 3. Substantially equating average droplet diameters $D_{AVG}$ across rows 1-3 may provide for droplets 66 to have volumes $V_D$ substantially equivalent to the targeted volume $V_T$.

Method of Calibrating Fluid Dispense System 32

Figure 8:
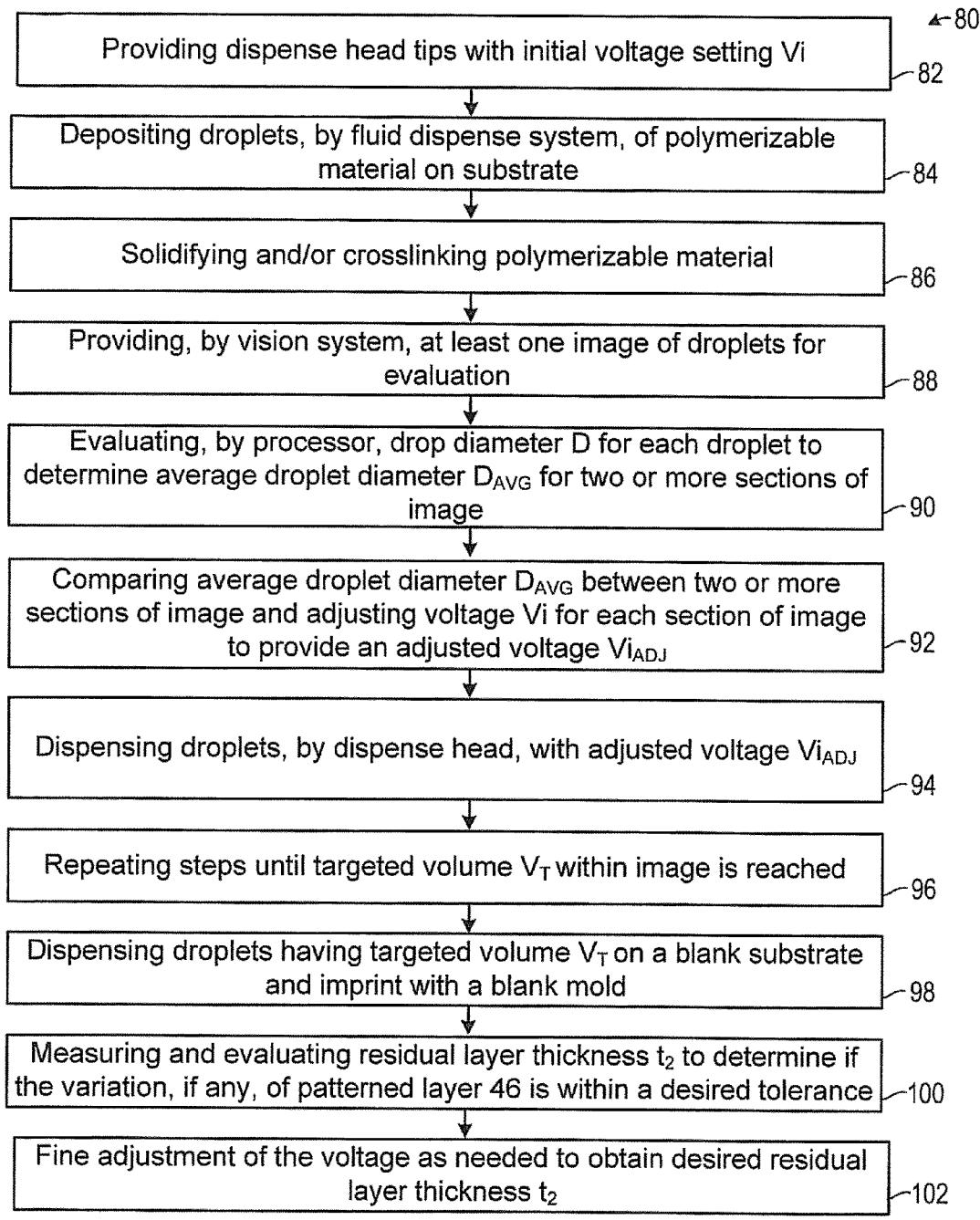
FIG. 8 illustrates a flow chart of an exemplary method for calibrating a fluid dispense system to provide substantially uniform droplets.

FIG. 8 illustrates a flow chart of an exemplary method for calibrating fluid dispense system 32 to provide droplets 66 having substantially the same targeted volume $V_T$. Specifics of exemplary methods are described below. However, the order in which the acts are described is not intended to be construed as a limitation, and any number of the described acts can be combined in other orders and/or in parallel to implement the process. Moreover, it should be understood that certain acts may be modified, and/or may be omitted entirely, depending on the circumstances.

In a step 82, dispense head 60 having tips 64a-64c may be provided with an initial voltage setting Vi. In an example, initial voltage setting Vi for each row 1-3 may be approximately 21.7 V.

In a step 84, dispense head 60 may position droplets 66 of polymerizable material 34 in a pattern on substrate 12. Each droplet 66 may be defined by droplet diameter D. In an example, in FIG. 7, dispense head 60 may deposit droplets 66a-i on substrate 12, each droplet 66a-i having droplet diameter $D_{A-1}$ associated therewith.

In a step 86, polymerizable material 34 may be solidified and/or crosslinked. It might be useful to note that step 86 may be optional.

In a step 88, vision system 70, shown in FIG. 3, may provide at least one image 74 of droplets 66 on substrate 12 for analysis. Image 74 may depict a single droplet 66, several droplets 66, or all of droplets 66.

In a step 90, image 74 may be evaluated by processor 54 to provide the drop diameter D for each droplet 66 and the number of droplets 66 within the image 74 and/or row. Additionally, average droplet diameter $D_{AVG}$ for two or more sections of image 74 may be determined. For example, droplet diameter $D_{AVG}$ may be determined for each row 1-3 illustrated in FIG. 7.

In a step 92, the average droplet diameter $D_{AVG}$ between droplets 66 may be compared to determine the adjusted voltage $Vi_{ADJ}$. For example, the average droplet diameter $D_{AVG}$ for each row 1-3 may be compared and the initial voltage Vi applied may be increased or decreased to provide adjusted voltages $Vi_{ADJ}$ for each row.

In a step 94, fluid dispense system 32 may dispense droplets 66 using adjusted voltage $Vi_{ADJ}$ for each row. In a step 96, steps 84-92 may be repeated using adjusted voltage $Vi_{ADJ}$ until targeted volume $V_T$ for droplets 66 within image 74 is obtained.

In a step 98, fluid dispense system 32 may dispense droplets 66 having targeted volume $V_T$ on a blank substrate 12 and imprint with a blank (substantially planer) mold, 20, to form a residual layer. In one example, droplets 66 in image 74 may be substantially uniform having targeted volume $V_T$.

In a step 100, residual layer thickness $t_2$, shown in FIG. 2, may be measured and evaluated to determine if the variation, if any, of patterned layer 46 is desirable or within a targeted tolerance of approximately +/−10 nm or less.

In a step 102, fine adjustment of the voltage as needed to obtain desired residual layer thickness Matching Dispense Heads Having differing drop volumes $V_D$ across droplets 66 may result in a varying residual layer thickness $t_2$, shown in FIG. 2, of patterned layer 46 and may eventually lead to pattern transfer problems, which is undesirable.

When imprinting substrate 12 using multiple dispense heads 60, it may be desired to have each dispense head 60 dispense substantially the same the drop volume $V_D$ ("matching the drop volumes"). Not matching the drop volumes may result in unmatched film thicknesses of patterned layer 46 that may lead to pattern transfer problems.

Previous technology did not provide for a fine adjustment of drop volume, i.e. changes to the film thickness were made via altering the drop patterns of droplets 66. This frustrated the drop pattern creation process and thus, drop patterns had to be tailored to individual dispensers and tools. Recipe portability was not problematic.

Figure 12:
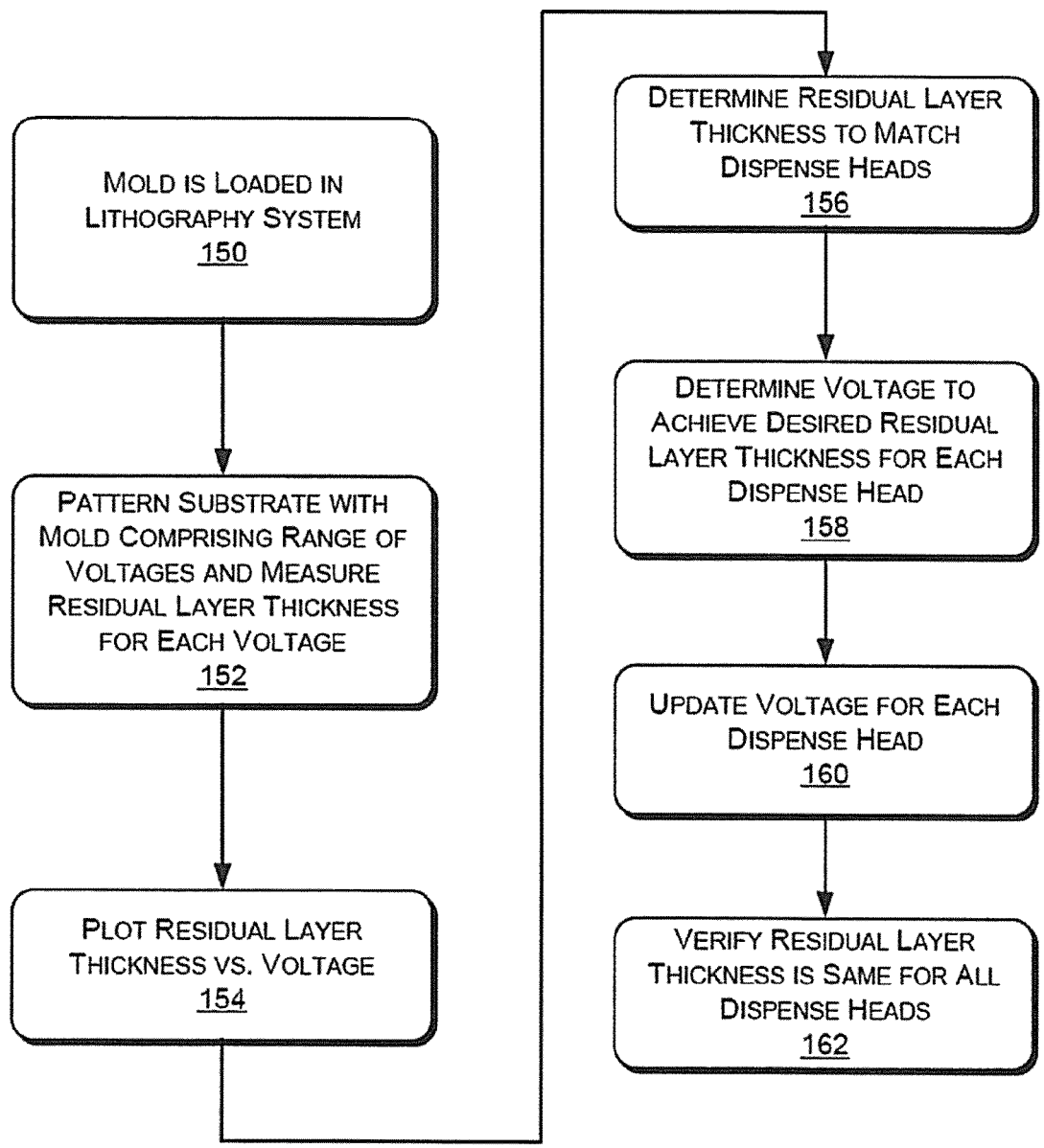
FIG. 12 illustrates a flow chart of a method of matching dispense heads.

To that end, FIG. 12 illustrates a flowchart for a method for matching each dispense head 60, wherein voltage adjustments are used to match the drop volume dispensed by each dispense head 60. Specifics of exemplary methods are described below. However, the order in which the acts are described is not intended to be construed as a limitation, and any number of the described acts can be combined in other orders and/or in parallel to implement the process. Moreover, it should be understood that certain acts may be modified, and/or may be omitted entirely, depending on the circumstances.

In a step 150, mold 20, comprising no pattern (i.e. substantially planar), is positioned within lithography system 10.

In a step 152, substrate 12 is patterned with mold 20 comprising a range of dispenser voltages Vi and for each dispenser voltage Vi, measure the residual layer thickness $t_2$ of the patterned layer 46.

Figure 13:
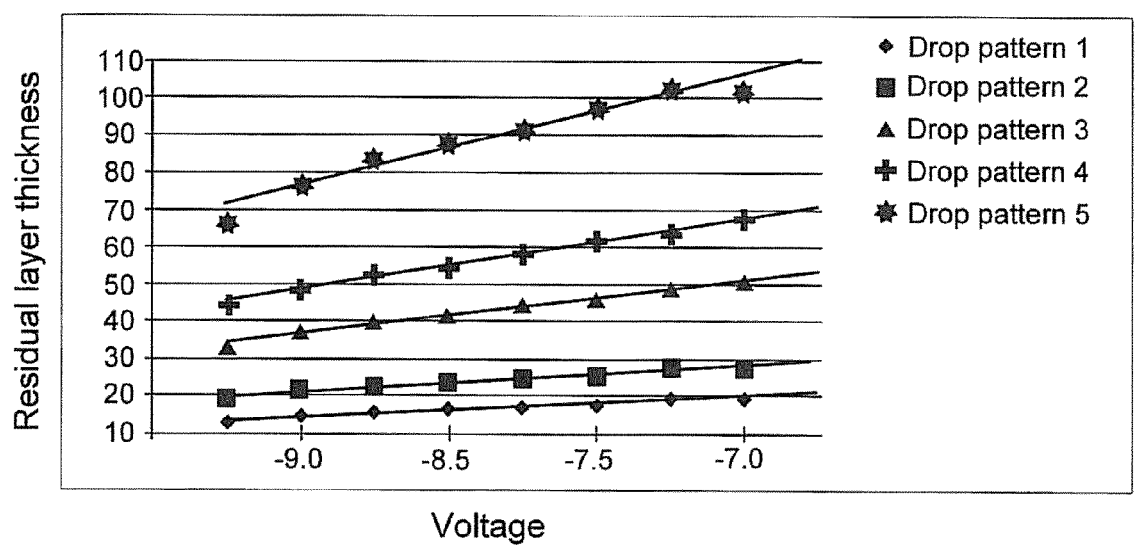
FIG. 13 a graphical representation of the relationship between voltage applied to a dispense head and the residual layer thickness.

In a step 154, plot the residual layer thickness $t_2$ vs. dispenser voltage Vi. FIG. 13 illustrates a graph of residual layer thickness vs. voltage correlation for various drop pattern grid density.

In a step 156, from the residual layer thickness measured for each dispenser voltage Vi, determine the desired residual layer thickness $t_2$ to match the dispense heads 60, i.e. each dispense head 60 dispenses substantially the same volume.

In a step 158, determine the voltage Vi to achieve the desired residual layer thickness $t_2$ (see step 156) for each dispense head 60 from the plot of FIG. 13 (see step 154).

In a step 160, update the voltage Vi for each dispense head 60.

In a step 162, pattern substrate 12 with mold 20 to verify the residual layer thickness $t_2$ is substantially the same for all dispense heads 60 at the new voltage settings.

Calculating Drop Volume $V_D$ of Droplets 66

Figure 9:
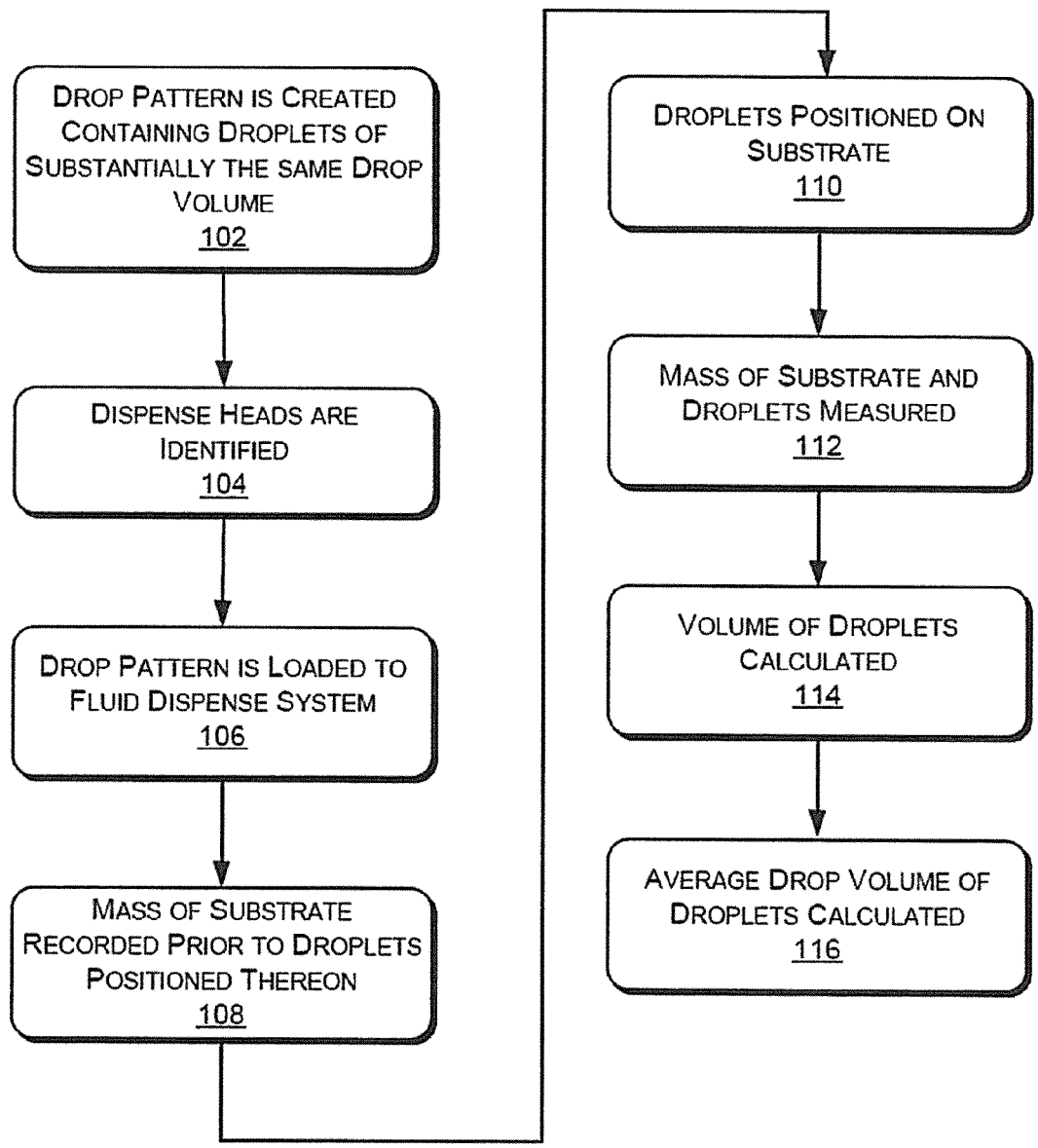
FIG. 9 illustrates a flow chart of a method exemplary method for calculating the drop volume of droplets.

FIG. 9 illustrates a flow chart of an exemplary method for calculating the drop volume $V_D$ of droplets 66. This process may be conducted online or offline. Specifics of exemplary methods are described below. However, the order in which the acts are described is not intended to be construed as a limitation, and any number of the described acts can be combined in other orders and/or in parallel to implement the process. Moreover, it should be understood that certain acts may be modified, and/or may be omitted entirely, depending on the circumstances.

In a step 102, a drop pattern is created containing droplets 66 of substantially the same droplet volume $V_D$.

In a step 104, the dispense heads 60 that are employed to create the drop pattern in step 102 are identified.

In a step 106, the created drop pattern is loaded to fluid dispense system 32. In an embodiment, fluid dispense system 32 may be set within an air flow free environment, or the dispensing process shielded from air flow. Further, substrate 12 is positioned within fluid dispense system 32.

In a step 108, a mass $M_S$ of substrate 12 is recorded prior to droplets 66 being positioned thereon.

In a step 110, droplets 66 are positioned on substrate 12. Droplets 66 may be positioned on substrate 12 until a mass is provided that is measurable by a balance measuring device (not shown). In an implementation, more than approximately 50 times. The number of droplets 66 positioned on substrate 12 may be defined as $N_D$.

In a step 112, a mass of droplets 66 positioned upon substrate 12 and substrate 12 is measured, defined as $M_T$.

In a step 114, a volume $V_{droplets}$ of droplets 66 is calculated as follows:

$$V_{droplets} = M_T - M_S \quad (1)$$

In a step 116, an average drop volume $V_{AVG}$ of droplets 66 is calculated as follows:

$$V_{AVG} = V_{droplets}/N_D \quad (2)$$

Figure 10:
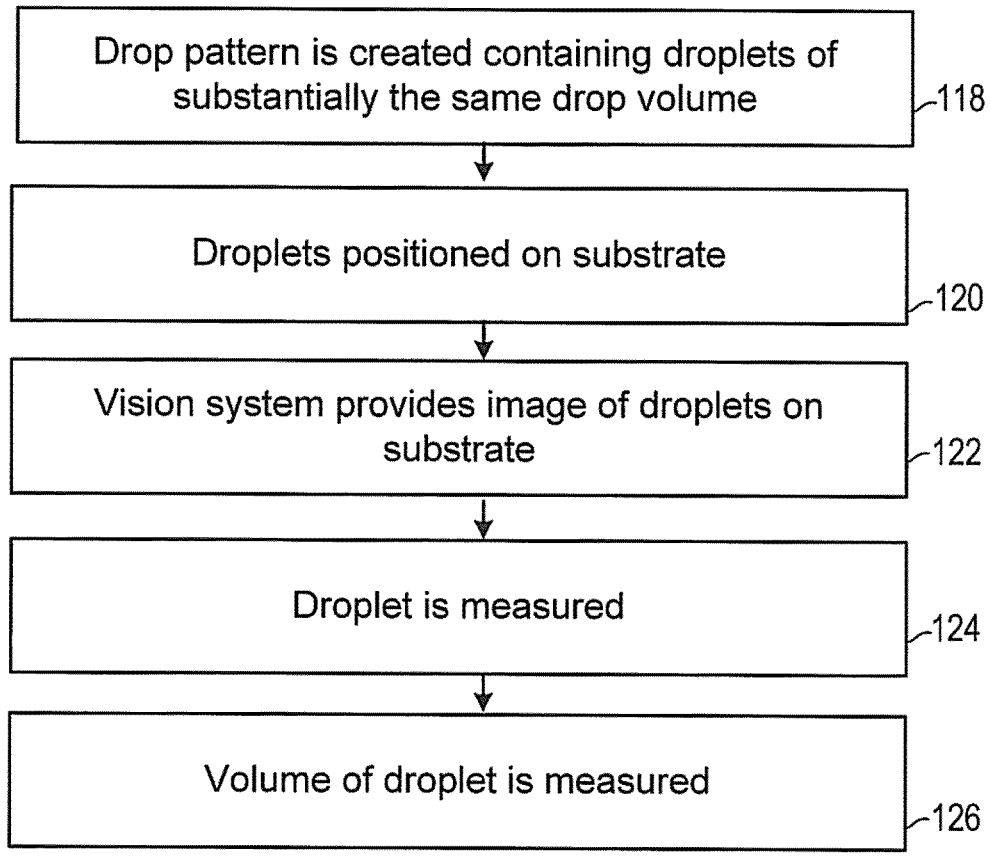
FIG. 10 illustrates a flow chart of an additional method for calculating the drop volume of droplets.

FIG. 10 illustrates a flow chart of an alternative method for calculating the drop volume $V_D$ of droplets 66. More specifically, for droplets 66 having a larger volume (e.g., approximately greater than 10 pL), a side profile of a droplet 66 may be imaged and then top down (above droplet 66) imaging may be employed to back out a droplet volume $V_D$ from the geometry thereof. Specifics of exemplary methods are described below. However, the order in which the acts are described is not intended to be construed as a limitation, and any number of the described acts can be combined in other orders and/or in parallel to implement the process. Moreover, it should be understood that certain acts may be modified, and/or may be omitted entirely, depending on the circumstances.

In a step 118, a drop pattern is created containing droplets 66 of substantially the same droplet volume $V_D$.

In a step 120, droplets 66 are positioned on substrate 12 via dispense head 60.

In a step 122, vision system 70 is employed to provide at least one image 74 of a profile of a droplet 66a on substrate 12.

Figure 11:
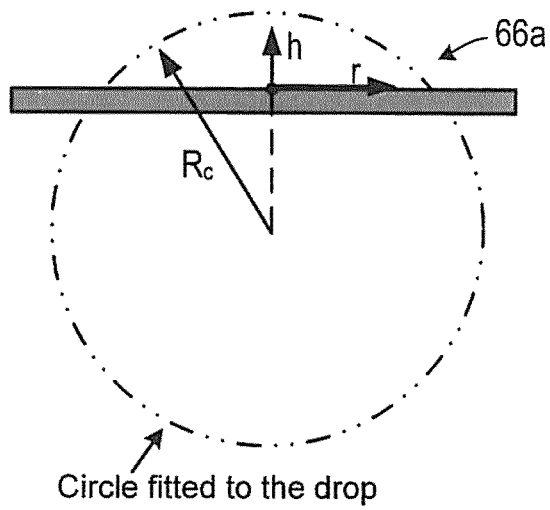
FIG. 11 illustrates a droplet positioned on a substrate.

In a step 124, droplet 66a of image 74 is then measured. More specifically, as shown in FIG. 11, a height h of droplet 66a, a radius r of droplet 66a, and a radius $R_C$ of the circle of droplet 66a is obtained.

In a step 126, a volume of droplet 66a (spherical cap) is calculated as follows:

$$V_{spherical\ cap} = \frac{1}{3}\pi h^2(3R_c - h)$$
$$= \frac{1}{6}\pi h(3r^2 + h^2)$$

The process of the flow chart of FIG. 10 may be repeated N number of times (for N droplets 66), and thus, an $V_{AVG}$ may be calculated.

In still a further embodiment, the drop volume $V_D$ of droplets 66 may be calculated while droplets 66 are in flight (as they are dispensed from the dispense head 60). More specifically, image 72 may be obtained as droplet 66a is a sphere with no interaction with substrate 12. The volume of droplet 66a is calculated as follows:

$$V_{drop} = \frac{4}{3}\pi r^3$$

CONCLUSION

Although embodiments have been described in language specific to structural features and/or methods, it is to be understood that the subject of the appended claims is not necessarily limited to the specific features or methods described. Rather, the specific features and methods are disclosed as exemplary implementations for providing remote auto provisioning and publication of applications.

What is claimed is:

1. A method of calibrating a plurality of dispense heads within a fluid dispense system, the method comprising:
   positioning a mold within the fluid dispense system, the mold having a substantially planar surface;
   altering a voltage applied to the plurality of dispense heads such that for each voltage applied:
   dispensing a plurality of droplets of polymerizable material from the plurality of dispense heads on a substrate;
   contacting the polymerizable material with the substantially planar surface of the mold and solidifying the polymerizable material to form a patterned layer on the substrate;
   measuring a residual layer thickness of the patterned layer;
   from the residual layer thickness measured from each voltage applied, determining a desired residual layer thickness such that each dispense head of the plurality of dispense heads dispenses substantially the same volume;
   determining the voltage applied associated with the desired residual layer thickness to define a desired voltage; and
   updating the plurality of dispense heads to have the desired voltage applied thereto.

2. The method of claim 1 further comprising verifying the desired film thickness is substantially the same for each of the plurality of dispense heads having the desired voltage applied thereto.

* * * * *